(12) United States Patent
Tahara

(10) Patent No.: US 6,246,633 B1
(45) Date of Patent: Jun. 12, 2001

(54) SEMICONDUCTOR MEMORY DEVICE PERMITTING STABILIZED OPERATION AND HIGH-SPEED ACCESS

(75) Inventor: Yoshiaki Tahara, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/477,559

(22) Filed: Jan. 4, 2000

(30) Foreign Application Priority Data

Jun. 24, 1999 (JP) ................................................ 11-177761

(51) Int. Cl.$^7$ ...................................................... G11C 8/00
(52) U.S. Cl. .............................. 365/230.08; 365/230.03; 365/230.06
(58) Field of Search ....................... 365/230.01, 230.08, 365/230.03, 230.06; 326/105, 104

(56) References Cited

U.S. PATENT DOCUMENTS

| 4,983,861 | * | 1/1991 | Kikuchi et al. | 326/14 |
| 5,548,560 | * | 8/1996 | Stephens, Jr. et al. | 365/233.5 |
| 5,694,369 | * | 12/1997 | Abe | 210/210 |
| 5,717,653 | * | 2/1998 | Suzuki | 365/233 |

FOREIGN PATENT DOCUMENTS 9-128977  5/1997  (JP).

* cited by examiner

Primary Examiner—Hoai V. Ho
(74) Attorney, Agent, or Firm—McDermott, Will & Emery

(57) ABSTRACT

The semiconductor memory device is provided with an address buffer. The address buffer includes address input circuits provided for respective bits of an address signal. Each address input circuit includes an address signal transmission circuit that is activated by an activation signal, a plurality of delay circuits provided in parallel, each delaying and outputting the output of the address signal transmission circuit, and a delay time select circuit that selects an output signal from one of the plurality of delay circuits according to the type of access and transmits the selected signal to an address decoder. Each of the plurality of delay circuits has a delay time different from each other. If an access is started with activation of the address buffer, a delay time that is shorter than a conventional case is set.

9 Claims, 11 Drawing Sheets

M (EVEN) NUMBER OF INVERTERS

N (EVEN) NUMBER OF INVERTERS

L (ODD) NUMBER OF INVERTERS

SEMICONDUCTOR MEMORY DEVICE PERMITTING STABILIZED OPERATION AND HIGH-SPEED ACCESS

BACKGROUND OF THE INVENTION

1. Field of the Invention

The present invention relates to semiconductor memory devices, and more particularly to a semiconductor memory device permitting high-speed access operation at a timing of activation of an address buffer, while reducing a stand-by current consumption.

2. Description of the Background Art

In a memory device in which a data signal is transmitted between a selected memory cell and an outside according to an externally supplied address signal, one known technique to reduce current consumption during stand-by is to provide a transmission circuit at an input stage of an address buffer taking in the address signal that is inactivated during stand-by. Provision of such a transmission circuit can prevent generation of an unnecessary through current within the address buffer.

To relax noise in the address signal and to secure margin for write recovery time in a static random access memory (SRAM), a prescribed delay time is added to the externally supplied address signal in an address buffer circuit, and the resulting address signal is applied to an address decoder performing selection of rows and columns of memory cells.

FIG. 11 is a block diagram illustrating a configuration of a conventional address buffer 500 and peripheral circuits thereof, to be used for these purposes.

Referring to FIG. 11, n+1 bits of address signal A0–An (n is a natural number) are input into address buffer 500, which in turn transmits each bit of the received address signal to an address decoder 560.

Address buffer 500 detects transition in signal level of each bit of the address signal, and transmits the information to a global ATD circuit 570. Global ATD circuit 570 outputs an address transition detecting signal GATD that is activated when the signal level changes in at least one of the bits of the address signal.

Address buffer 500 receives the address signal from address signal input terminals 501-0 to 501-n that are provided corresponding to respective bits of the address signal. Address buffer 500 receives from a node n101 an address buffer activation signal FACT generated by an address buffer activation circuit 550. Address buffer activation circuit 550 activates (to an L level) address buffer activation signal FACT in response to the activation (to an L level) of a chip select signal /CS designating activation of the entire memory device.

Address buffer 500 further includes address signal input circuits 510-0 to 510-n that are provided corresponding to respective bits of the address signal. As each address signal input circuit has the same configuration and operates in the same manner, the configuration of address input circuit 510-0 provided corresponding to a leading bit A0 of the address signal will now be described representatively.

Address input circuit 510-0 includes an address signal transmission circuit 520 that is activated in response to address buffer activation signal FACT. Address signal transmission circuit 520 is a circuit provided for reducing the current consumption of the address buffer during stand-by.

FIG. 12 is a circuit diagram showing a configuration of address signal transmission circuit 520.

Referring to FIG. 12, address signal transmission circuit 520 includes P type MOS transistors Q50, Q51, coupled in series between a power supply line and a node N1, and an N type MOS transistor Q52 coupled between node N1 and a ground line. Transistors Q51 and Q52 have gates connected to address signal input terminal 501-0, and transistor Q50 has a gate connected to node n101.

Address signal transmission circuit 520 further includes an N type MOS transistor Q53 connected between node N1 and the ground line. Transistor Q53 has a gate connected to node n101. With such a configuration, transistor Q53 turns on and transistor Q50 turns off when address buffer activation signal FACT is at an inactive state (of an H level). Thus, address signal A0 is not transmitted to node N1, and the voltage level of node N1 is fixed at a ground voltage GND (at an L level) by transistor Q53.

In contrast, when address buffer activation signal FACT is activated (to an L level), transistor Q53 turns off and transistor Q50 turns on. Thus, node N1 is separated from the ground line, and an inverter formed of transistors Q51 and Q52 to which a current is supplied by transistor Q50 inverts the signal level of address signal A0 and transmits the inverted state to node N1.

The signal level at node N1 is transmitted to node n102 via inverters IV51 and IV52.

With such a configuration, it is possible to cut a through current at address signal transmission circuit 520, regardless of the signal level of address signal A0. Furthermore, since the signal level at node N1 during stand-by can be set in advance, it is also possible to cut the through current at each of post-connected circuits on stand-by without difficulty.

Referring to FIG. 11 again, address signal input circuit 510-0 further includes a delay circuit 530 that outputs to node n106 a change in voltage level at node n102 after a lapse of delay time td, and a local ATD circuit 540 that outputs to node n107 a one-shot pulse that is activated (to an L level) when the voltage level at node n102 changes.

The voltage levels at nodes n106 and n107 are inverted by inverters IV53 and IV56 and transmitted to nodes n103 and n104, respectively. Output to node n103 is a data signal DA0 that corresponds to the signal level of the input address signal. Similarly output to node n104 is a one-shot pulse signal LA0 that is activated (to an H level) when address signal A0 changes from an H level to an L level or from the L level to the H level.

Delay time td is set by delay circuit 530 such that a sufficient time is guaranteed for relaxing noise of the address signal input to the address input terminals, or for securing margin for write recovery time.

Other address signal input circuits 510-1 to 510-n operate in the same manner, and similarly output signals DA1 to DAn and LA1 to LAn. Address decoder 560 generates address select signals AS0 to ASn for selecting an address corresponding to the signal level given to each bit at each of the address signal input terminals.

Global ATD circuit 570 receives outputs LA0 to LAn from respective local ATD circuits and, when at least one of the signals LA0 to LAn is activated, activates address transition detecting signal GATD by adding an appropriate delay time thereto. GATD is a pulse signal activated for a prescribed time period, which detects start of a new access by monitoring switching of the address signal. For example, this signal GATD can be used to control equalization of data lines or the like such that the equalizing operation is completed immediately before the activation timing of word lines. Data reading and writing operations can thus be sped up.

The above-described delay time to be added by global ATD circuit 570 can be adjusted to obtain optimal timing between activation of LA0 to LAn at local ATD circuits and activation of word lines.

Now, another configuration of conventional address buffer will be described, in the case where it has a byte control function that enables portion-by-portion switching between activation and inactivation of a word configuration to be handled.

FIG. 13 is a block diagram showing a configuration of a conventional address buffer having the byte control function and peripheral circuits thereof.

In FIG. 13, the configuration of an address buffer activation circuit 555 is different from that of address buffer activation circuit 550 shown in FIG. 10.

Referring to FIG. 13, address buffer activation circuit 555 receives byte control signals /BC1 and /BC2. The byte control signal is a signal that controls switching between activation and inactivation for every byte, by dividing a word configuration having, for example, 16 bits into 2 bytes of 8 bits each. Each of byte control signals /BC1 and /BC2 is inactivated (to the H level) when the corresponding byte is inactivated.

Address buffer activation circuit 555 includes: a logic circuit 550 that receives a chip select signal /CS and a ground voltage GND as two inputs and outputs a result of their NOR operation to node n301; an inverter IV50 that inverts the signal level of node n301; a logic circuit 562 that receives an output of inverter IV50 and signal /BC1 as its inputs and outputs their NOR operation result; a logic circuit 564 that receives the output of inverter IV50 and signal /BC2 as its inputs and outputs the NOR operation result; and a logic circuit 566 that receives outputs of logic circuits 562 and 564 and outputs their OR operation result.

Address buffer activation circuit 555 further includes a logic gate LG50 that receives outputs of logic circuits 550 and 566 as two inputs and outputs their NAND operation result. The output of logic gate LG50 is transmitted as address buffer activation signal FACT via node n101 to each address input circuit.

With such a configuration, address buffer activation signal FACT recognizes the stand-by state when both byte control signals /BC1 and /BC2 are at an inactive state (at an H level) and when chip select signal /CS is at an inactive state (at an H level), and inactivates the address buffer.

Conversely, if chip select signal /CS is activated and at least one of byte control signals /BC1 and /BC2 is activated (to the L level), i.e., one or more bytes are activated, then it recognizes the active state and activates the address buffer.

Therefore, it is possible to determine activation/inactivation of the address buffer according to a combination of chip select signal /CS and byte control signals /BC1, /BC2.

FIG. 14 is a timing chart illustrating an operation of the address buffer described in conjunction with FIG. 11 and problems that pose.

Referring to FIG. 14, with an access during the time from T0 to T1, address signal A0 is at the L level, and thus, address A(0) is selected.

When chip select signal /CS is activated (to the L level) at time T0, the address buffer activation circuit activates (to the L level) address buffer activation signal FACT after a lapse of time tf, whereby the voltage level of node n10l is changed. In response thereto, the voltage level of node n102 rises to the H level at timing t2, and after a lapse of delay time td, the voltage level of node n106, i.e. the output of delay circuit 530, rises to the H level.

In response thereto, the voltage level of node n103 changes. Address select signal AS0 is set to the H level, while AS1 is set at the L level.

When address signal A0 changes from the L level to the H level at time T1, the voltage level of node n102 changes in response, since address buffer activation signal FACT is already activated. Furthermore, at timing t7 after a lapse of time td, the voltage level of node n106, to which the output of delay circuit 530 is transmitted, changes to the L level.

In response thereto, signal DA0 being output to node n103 rises from the L level to the H level at timing t16. In response, address select signals AS0 and AS1, output by address decoder 560, change to the L level and to the H level, respectively.

Therefore, in the case where an access operation is started with the activation of the address buffer in response to the activation of /CS signal at time T0 (hereinafter, also referred to as "CS access"), a time period from the start of access to the time when the address select signal is output is expressed as "tcs".

In contrast, in the case where the access operation is started by the change of the address signal at time T1 after the address buffer is activated (hereinafter, also referred to as "address access"), a time period from the time when the address signal changes to the time when address select signals AS0 and AS1 respond to the change of the address signal is expressed as "tad".

As seen from FIG. 14, delay time tad in the case of address access is determined by delay time td that is added by delay circuit 530, whereas access time tcs in the case of CS access is determined by the sum of delay time td that is added by delay circuit 530 and time tf that is needed for the address buffer activation circuit to activate signal FACT. Thus, the delay in the case of CS access is greater than that in the case of address access. In other words, an unnecessarily long delay time will be added in the access operation involving activation of the address buffer.

Precharge operation of data lines or the like needs to be completed before the address select signals are set to drive word lines. Therefore, address transition detecting signal GATD is activated during the time period from t22 to t23 before timing t64 when the address select signal is switched, with the change in voltage level at node n102 as a starting point. Likewise, in the case of address access, address transition detecting signal GATD is activated during the time period from t24 to t25 before the address select signals AS0 and AS1 are set.

In the case of CS access, the time period from the activation of /CS signal to the time when address signal transmission circuit 520 is activated and the voltage level of node n102 is changed increases as the number of address bits or wiring resistance and wiring capacitance of node n101 increases. Thus, there has been a problem of reduction in the CS access speed with the increase in the size of the semiconductor memory device to be mounted.

FIG. 15 is a timing chart illustrating the operation of the address buffer shown in FIG. 12 having the byte control function and problem thereof.

Referring to FIG. 15, with an access during the time from T0 to T1, address A0 is at the L level, and thus, address A(0) is selected. With an access during the time from T1 to T2, address A0 is at the H level, and therefore, address A(1) is selected.

Similar to the case of FIG. 14, the address buffer is activated because signal /CS, and also signals /BC1 and /BC2 in this case, are activated at time T0.

However, in the case where the access operation is started with activation of the address buffer in response to the activation of signals /BC1 and /BC2 (hereinafter, also referred to as "BC access"), the voltage level of address buffer activation signal FACT, i.e., the voltage level of node n101, is actually changed at timing t83, time tff later than time T0. At this timing, the address signal is taken into the address input circuit, and the voltage level of node n102 changes.

With this timing as a starting point, the voltage level of each node changes, and at timing t91 after a lapse of delay time td, address select signal AS0 changes from the L level to the H level.

Likewise, address transition detecting signal GATD is activated at a time period from t92 to t93 prior to timing t91, in response to the change in the voltage level of node n102.

In the case of address access that is started after the address buffer has been activated, the voltage level of address signal A0 changes at time T1, and in response, the voltage level of node 102 changes.

Therefore, in this address access, it is possible to set the voltage level of the address select signal relatively quickly. Specifically, address select signal AS1 can be set to the H level at timing t21, only tad later than time T1. Address transition detecting signal GATD is activated during a time period from timing t94 to timing t95 before timing t21, with the change in the voltage level of node n102 as a starting point.

Comparing FIG. 15 with FIG. 14, address buffer activation circuit 555 determines activation of the address buffer activation signal, not according to the signal CS only, but according to the combination of the states of chip select signal CS and byte control signals /BC1 and /BC2. Therefore, it is necessary to provide logic circuits 562, 564 and 566 additionally. It has also been found that the delay time tff from the timing when the setting of these control signals changes to the timing when the address buffer activation signal is actually activated is further increased. Thus, the delay amounts for the CS and BS accesses tend to increase with the increase in the size of the semiconductor memory devices, which hinders speeding of the entire memory device.

Taking only speed into consideration, some countermeasures may be considered, such as giving up control of activation of the address signal transmission circuit by a combination of chip select signal /CS and byte control signals /BC1 and /BC2, and decreasing delay time td being set by delay circuit 530. If these countermeasures are conducted, however, there may arise disadvantages such as an increase in current consumption during stand-by, and a decrease in margin for write recovery time.

SUMMARY OF THE INVENTION

An object of the present invention is to provide a configuration of a semiconductor memory device that permits high-speed access operation allowing both faster and stabilized operation, by appropriately setting a delay time to be added at an address buffer according to the type of access.

In summary, the present invention is a semiconductor memory device that performs an operation cycle to input/output a data signal in response to a command signal and an address signal supplied to signal input nodes, which includes a memory cell array, an address decode circuit, a control circuit, and an address buffer circuit.

The memory cell array has a plurality of memory cells arranged in rows and columns. The address decode circuit selects at least one of the memory cells according to the address signal. The control circuit activates an address buffer activation signal in response to the command signal for starting a capturing operation of the address signal. The address buffer circuit is provided between the signal input nodes and the address decode circuit, and performs/stops transmission of the address signal to the address decode circuit in response to the address buffer activation signal, and transmits the address signal to the address decode circuit after a lapse of either one of a first and a second delay times.

Therefore, a primary advantage of the present invention is that the delay time to be added by the address buffer can be switched between a case of an access that is started with activation of the address buffer activation signal and a case of an access that is started when the address buffer activation signal is already at the active state, such that, in the former access case, an adequate write recovery time can be guaranteed to stabilize the operation, and also in the former access case, the effect of the delay time generated by the control circuit at the time of activation of the address buffer activation signal can be eliminated to speed the access operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
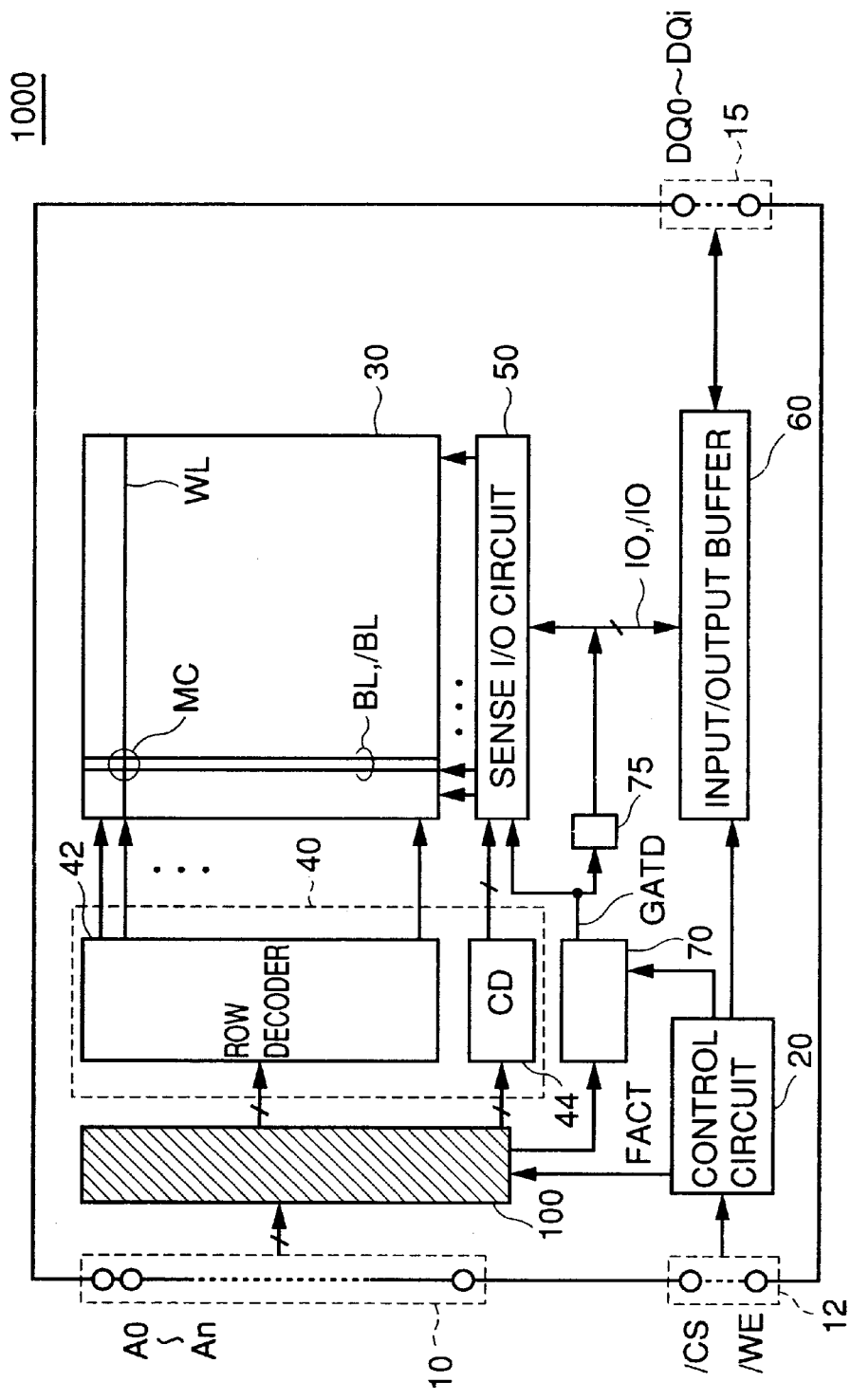
FIG. 1 is a schematic block diagram showing an entire configuration of a semiconductor memory device 1000 according to an embodiment of the present invention.

Hereinafter, embodiments of the present invention will be described in detail with reference to the drawings, wherein the same and corresponding portions are denoted by the same reference characters.

First Embodiment

FIG. 1 is a schematic block diagram showing an entire configuration of a semiconductor memory device 1000 according to the first embodiment of the present invention.

Referring to FIG. 1, semiconductor memory device 1000 includes: address signal input terminals 10 receiving respective bits A0–An (n is a natural number) of an address signal; control signal input terminals 12 receiving control signals including a chip select signal /CS and a write enable signal /WE; and an input/output data terminal 15 sending and receiving input/output data DQ0–DQi (i is a natural number) to and from an outside.

Semiconductor memory device 1000 further includes a memory cell array 30 in which a plurality of memory cells are arranged in rows and columns. In memory cell array 30, word lines WL are provided corresponding to respective rows of memory cells, and bit line pairs BL, /BL are provided corresponding to respective columns of memory cells. A memory cell MC is disposed at each crossing of word line and bit line pair. A target memory cell for sending/receiving data is selected according to a combination of signal levels of respective bits A0–An of the address signal.

Semiconductor memory device 1000 includes a control circuit 20 designating performance and timing of read/write operations of the entire semiconductor memory device according to the control signals. Control circuit 20 generates, in response to the combination of the signal levels of the control signals, an address buffer activating signal FACT that designates activation of an operation for taking into address buffer 100 respective bits A0–An of the address signal given to the address signal input terminals.

Semiconductor memory device 1000 further includes an address buffer 100 that is activated in response to control signal FACT to receive each bit A0–An of the address signal and transmit the signal level of each bit of the address signal to an address decoder 40.

Address decoder 40 includes a row decoder 42 and a column decoder 44. Row decoder 42 selectively activates a word line corresponding to the address signal and reads out data to a bit line pair. Column decoder 44 selectively activates a column corresponding to the address signal and connects the corresponding bit line pair to a sense I/O circuit 50.

Sense I/O circuit 50 and input/output buffer 60 are connected by a data input/output line pair IO, /IO. Input/output buffer 60 sends and receives a data signal to and from data input/output terminal 15.

Data input/output line pair IO, /IO transmits write data received from input/output buffer 60 to sense I/O circuit 50. Read data read out to sense I/O circuit 50 are transmitted by data input/output line pair 10, /IO, and read out via input/output buffer 60 from data input/output terminal 15.

Semiconductor memory device 1000 further includes a global ATD circuit 70 that generates an address transition detecting signal GATD that detects start of a new read/write cycle by monitoring a change in the address signal.

In response to the activation of address transition detecting signal GATD, a bit line precharge circuit (not shown) and an I/O line precharge circuit 75 provided within sense I/O circuit are activated to precharge data lines such as bit line pairs and data input/output line pairs to a prescribed precharge voltage. Performing the precharge prior to read/write operations can speed up data read and write operations at data lines.

Figure 2:
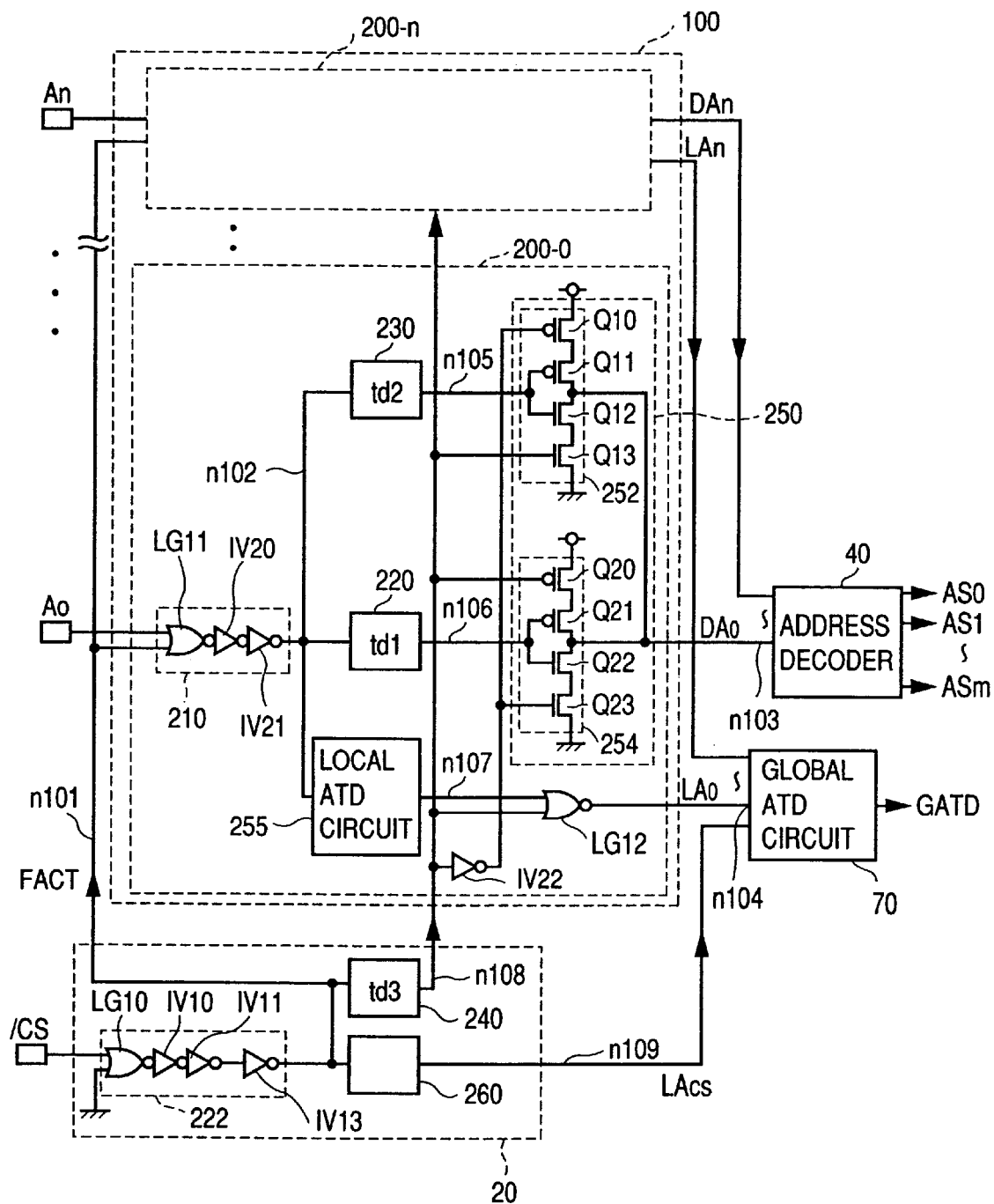
FIG. 2 is a block diagram showing a configuration of an address buffer 100 and peripheral circuits thereof

FIG. 2 is a block diagram illustrating a configuration of address buffer 100 and its peripheral circuits.

Referring to FIG. 2, address buffer 100 includes address signal input circuits 200-0 to 200-n provided for respective bits of the address signal. Hereinafter, a configuration of address signal input circuit 200-0 provided corresponding to a leading bit A0 of the address signal will be described representatively.

Address signal input circuit 200-0 is activated by address buffer activating signal FACT generated by control circuit 20.

Control circuit 20 includes an address buffer activating circuit 222 disposed between a /CS signal input terminal and a node n101 from which signal FACT is output. Address buffer activation circuit 222 includes a logic gate LG10 and inverters IV10, IV11 and IV13, and outputs a result of OR operation of chip select signal 1CS and a ground voltage GND. Thus, signal FACT is inactivated (at an H level) while chip select signal ICS is in an inactive state (of an H level), and activated (to an L level) in response to activation of /CS signal (to an L level).

Control Circuit 20 further includes a delay circuit 240 that transmits the voltage level of node n101, on which signal FACT is output, to node n108 after a lapse of delay time td3, and a pulse generating circuit 260 that outputs a one-shot pulse signal LAcs activated (to an H level) in response to activation of signal FACT to a node n109.

Address signal input circuit 200-0 includes an address signal transmission circuit 210 that transmits leading bit A0 of the address signal to a post-connected circuit in response to activation of address buffer activation signal FACT. Address signal transmission circuit 210 is a circuit provided for reducing current consumption while the operation of taking in the address signal is inactivated, as described in the background art section, and is configured as a logic circuit that receives control signal FACT and address signal A0 and outputs a result of their NOR logic operation.

As described above, in the case where address buffer activation signal FACT is in an inactive state, the voltage level of node n102 is fixed at the L level, and when the operation of taking in the address signal is activated, the voltage level obtained by inverting the signal level of leading bit A0 of the address signal is output to node n102.

Address signal input circuit 200-0 further includes delay circuits 220 and 230 receiving the signal transmitted to node n102 as their intputs, and a local ATD circuit 255.

Delay circuit 220 outputs the voltage level at node n102 to node n106 after a lapse of delay time td1. Likewise, delay circuit 230 outputs the voltage level generated at node n102 to node n105 after a lapse of delay time td2.

Local ATD circuit 255, which monitors a change in the signal level of leading bit A0 of the address signal, outputs to node n107 a one-shot pulse signal that is activated (to an L level) when the voltage level of node n102 changes from the H level to the L level or from the L level to the H level.

Address signal input circuit 200-0 further includes a delay time select circuit 250 that selects either one of the outputs of two delay circuits 220 and 230 to output signal DA0, in response to the fact that the operation cycle is of either CS access or address access.

Signal DA0 having the same signal level as that of leading bit A0 of the address signal is output to node n103.

Delay time select circuit 250 includes a clocked inverter 252 connected between nodes n105 and n103, and a clocked inverter 254 provided between nodes n106 and n103.

Clocked inverters 252 and 254 are activated in response to the voltage level of node n108.

Clocked inverters 252 and 254 are activated complementarily to each other. Specifically, clocked inverter 252 is activated when the voltage level at node n108 is at an H level, while clocked inverter 254 is activated when the potential at node n108 is at the L level. Delay circuit 240 changes the voltage level of node n108 from the H level to the L level at a timing that is delay time td3 behind the timing of activation of address buffer activation signal FACT.

Delay time td1 of delay circuit 220 and delay time td2 of delay circuit 230 have a relation set as td1>td2.

Here, td1 is set such that an adequate time is guaranteed for relaxing noise of the address signal input to the address input terminal, or for securing margin for write recovery time.

Delay time td2 is applied in the case of CS access, that is set shorter than td1, taking into consideration the time required before the activation of address buffer activation signal FACT.

Delay time td3 of delay circuit 240 is set such that the output of delay circuit 230 is transmitted to node n103 at the time of CS access, and such that the output of delay circuit 220 is transmitted to node n103 at the time of address access. Specifically, td3 is set such that td3>td1, and also set such that the voltage level of node n108 is changed to the L level before the cycle started by the CS access is completed.

With such a configuration, it becomes possible to add different delay times, when transmitting an address signal, dependent on the access types. Specifically, it is possible to transmit the output with short delay time td2 added thereon to the address decoder, in the case of CS access where conventionally a time required from activation of /CS signal to activation of FACT signal was added as a further delay time. It is also possible to transmit the output with normal delay time td1 added thereon to address decoder 40 in the case of address access where it is unnecessary to take into consideration the delay time by address buffer activation circuit 222 within control circuit 20.

Address decoder 40 determines the voltage levels of address select signals AS0 and AS1 corresponding to the voltage level of signal DA0 output to node n103, and activates a row or a column of corresponding memory cell.

Each of the other address signal input circuits 200-1 to 200-n operate in the same manner, and thus, signals DA1 to DAn corresponding to the remaining bits A1 to An of the address signal are transmitted to address decoder 40. Address decoder 40 responds to these signals by generating address signals AS2 to ASm, to selectively activate the row or column of the corresponding memory cell.

Address signal input circuit 200-0 further includes a local ATD circuit 255 that outputs to node n107 a local ATD signal being a one-shot pulse signal to be activated in response to the change in the voltage level of node n102.

In address signal input circuit 200-0, delay times to be set in the case of CS access and in the case of address access are different from each other. Therefore, at the time of CS access, it is necessary to activate address transition detecting signal GATD, not by the output of local ATD circuit, but directly corresponding to the timing of activation of address buffer activation signal FACT.

Address input circuit 200-0 further includes a logic gate LG12 that outputs to node n104 a result of NOR operation of the local ATD signal and the voltage level of node n108 as a signal LA0.

Accordingly, node n104 is held at the L level while the voltage level of node n108 is at the H level. After the voltage level of node n108 changes to the L level delay time td3 later than the activation of signal FACT, a one-shot pulse signal is output in response to the activation of local ATD signal. Signal LA0 is transmitted via node n104 to global ATD circuit 70. Each of the other address signal input circuits 200-1 to 200-n likewise monitors the change in the signal level of corresponding bit and generates signal LA1 to LAn.

Figure 3:
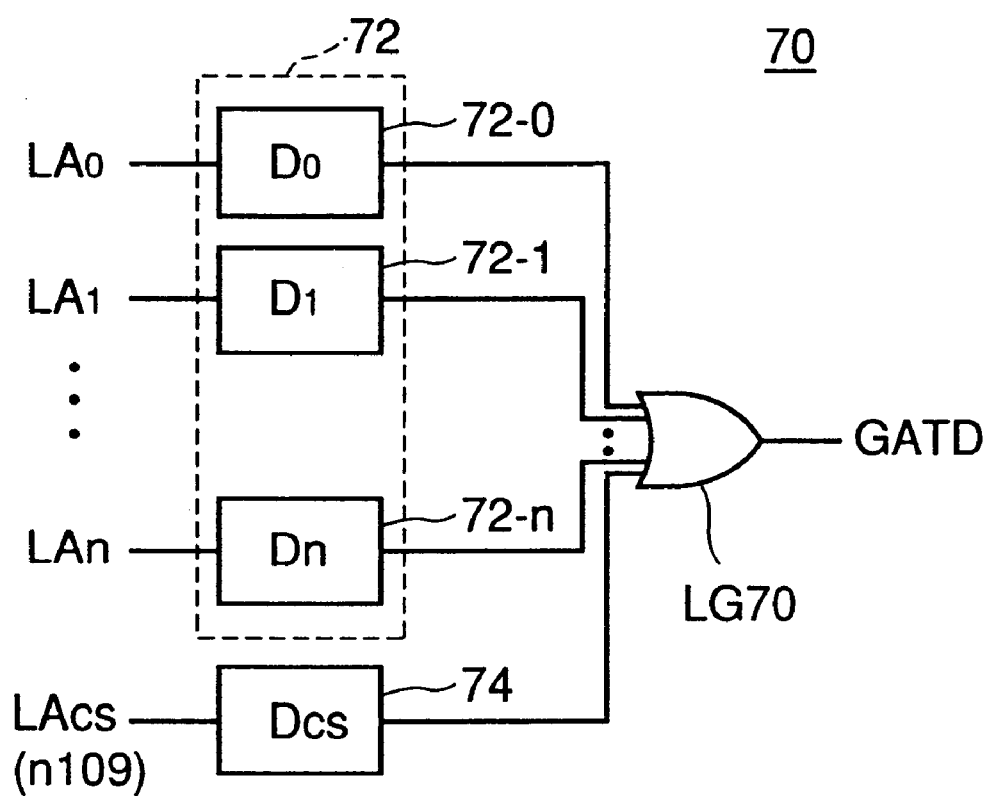
FIG. 3 is a circuit diagram showing a configuration of a global ATD circuit 70.

FIG. 3 is a circuit diagram showing a configuration of global ATD circuit 70.

Referring to FIG. 3, global ATD circuit 70 includes delay circuits 72-0 to 72-n each receiving one-shot pulse signal LA0 to LAn transmitted from each address signal input circuit, and a delay circuit 74 that receives a one-shot pulse LAcs output from pulse generating circuit 260 in the case of CS access.

Global ATD circuit 70 further includes a logic gate LG70 that receives outputs of delay circuits 72-0 to 72-n and 74, to activate address transition detecting signal GATD if at least one signal is activated.

Delay times D0 to Dn and Dcs set at respective delay circuits can be adjusted dependent on the relation between the timing of activation of LA0 to LAn by local ATD circuit and of LAcs by pulse generating circuit 260 and the timing of word line activation performed after the address signal is transmitted to the address decoder. Specifically, delay times D0 to Dn are determined corresponding to delay time td1 that is added at the address input circuit in the case of address access, and delay time Dcs is determined corresponding to delay time td2 that is added at the address input circuit in the case of CS access. Thus, delay time Dcs is set to be shorter than each of delay times D0 to Dn. Note that it is also possible to reduce the number of delay circuits by having a common value for delay times D0 to Dn.

With such a configuration, global ATD circuit 70 activates address transition detecting signal GATD, at the time of CS access, according to the signal LAcs output from pulse generating circuit 260, and activates GATD, at the time of normal address access, when at least one of local address transition detecting signals LA- to LAn is activated, as in the conventional case.

Accordingly, even if the CS access is implemented at higher speed, it is possible to activate address transition detecting signal GATD at an optimal timing that conforms to the timing of address selection. This permits control of precharging of an appropriate data line and the like.

A configuration of each delay circuit will now be described.

Figure 4:
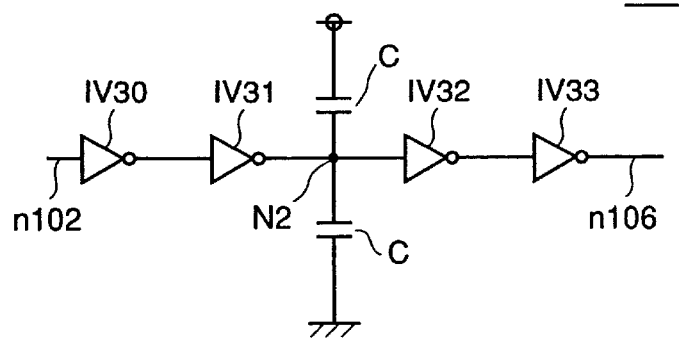
FIG. 4 is a circuit diagram showing an example of a configuration of a delay circuit 220.

FIG. 4 is a circuit diagram showing an example of the configuration of delay circuit 220.

Referring to FIG. 4, delay circuit 200 includes: inverters IV30, IV31 connected in series between node n102 and an intermediate node N2; and inverters IV32, IV33 connected in series between intermediate node N2 and node n106. Delay circuit 220 further includes capacitors C connected between a power supply line and intermediate node N2 and between intermediate node N2 and a ground line.

With such a configuration, delay circuit 220 sets delay time td1 corresponding to the operating speed of each inverter, the number of inverters connected and the capacitance values of capacitors C, and transmits the voltage level of node n102 to node n106.

Figure 5:
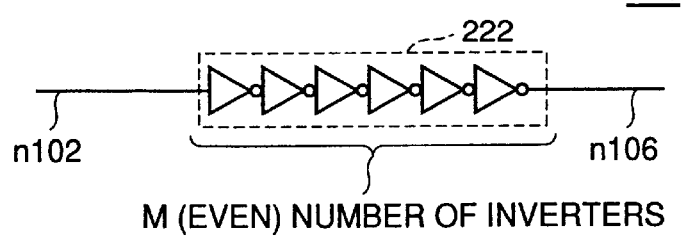
FIG. 5 is a circuit diagram showing another example of the configuration of delay circuit 220.

FIG. 5 is a circuit diagram showing another example of the configuration of delay circuit 220.

Referring to FIG. 5, delay circuit 220 includes an inverter train 222 connected between nodes n102 and n106. Inverter train 222 includes M inverters (M is an even natural number). With such a configuration, delay circuit 220 is able to set delay time td1 by adjusting the delay time of each inverter and the number of inverters.

Delay circuit 230 may have basically the same configuration as those shown in FIGS. 3 and 4, and includes therein an inverter train with an even number of inverters. However, by reducing, for example, the number of inverters, the operating speed of each inverter and the capacitance value of each capacitor C, it is possible to set delay time td2 that is smaller than td1.

Further, in the case where a large delay time is added by address buffer activation circuit 222, it is unnecessary to add a further delay time by delay circuit 230. In this case, delay circuit 230 may be configured to connect node n102 and node n105 directly.

Figure 6:
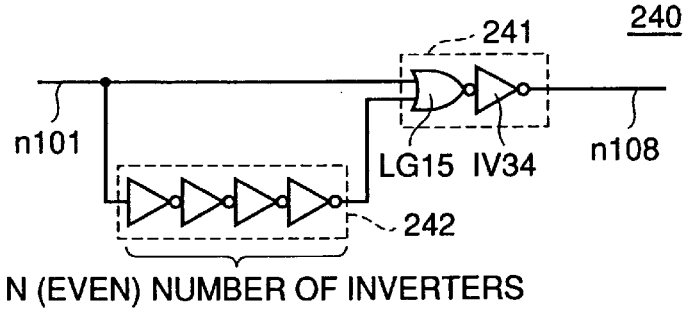
FIG. 6 is a circuit diagram showing a configuration of a delay circuit 240.

FIG. 6 is a circuit diagram showing a configuration of delay circuit 240.

Referring to FIG. 6, delay circuit 240 includes an inverter train 242 for transmitting the voltage level of node n101 by adding delay time td3 thereto, and a logic circuit 241 that outputs a result of OR operation of address buffer activation signal FACT output to node n101 and the output of inverter train 242.

Inverter train 242 has N inverters (N is an even natural number). Delay time td3 is determined by the number N of inverters included within inverter train 242. With such a configuration, when address buffer activation signal FACT is activated, or, when the voltage level of node n101 changes from the H level to the L level, the voltage level of node n108 is set to the L level delay time td3 behind the timing of activation of FACT.

Figure 7:
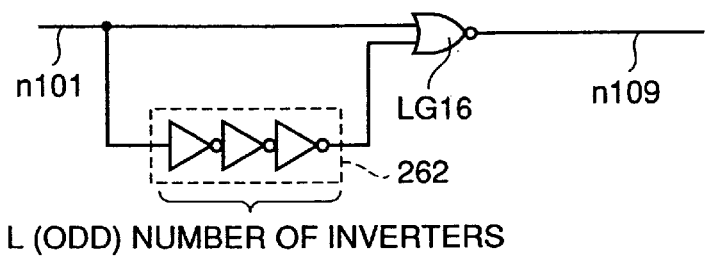
FIG. 7 is a circuit diagram showing a configuration of a pulse generating circuit 260.

FIG. 7 is a circuit diagram showing a configuration of pulse generating circuit 260.

Referring to FIG. 7, pulse generating circuit 260 includes: an inverter train 262 receiving the voltage level of node n101 as its input; and a logic gate LG16 that outputs a result of NOR operation of the address buffer activation signal transmitted on node n101 and the output of inverter train 262. Inverter train 262 includes L inverters (L is an odd natural number). Inverter train 262 delays and inverts address buffer activation signal FACT and outputs the resulting signal.

With such a configuration, a one-shot pulse signal is output on node n109, that is activated from the timing of activation of address buffer activation signal FACT (from the H level to the L level), only during the delay time added by inverter train 262.

In response to the one-shot pulse signal output to node n109, in the case of CS access, global ATD circuit 70 activates address transition detecting signal GATD for a prescribed time period.

Figure 8:
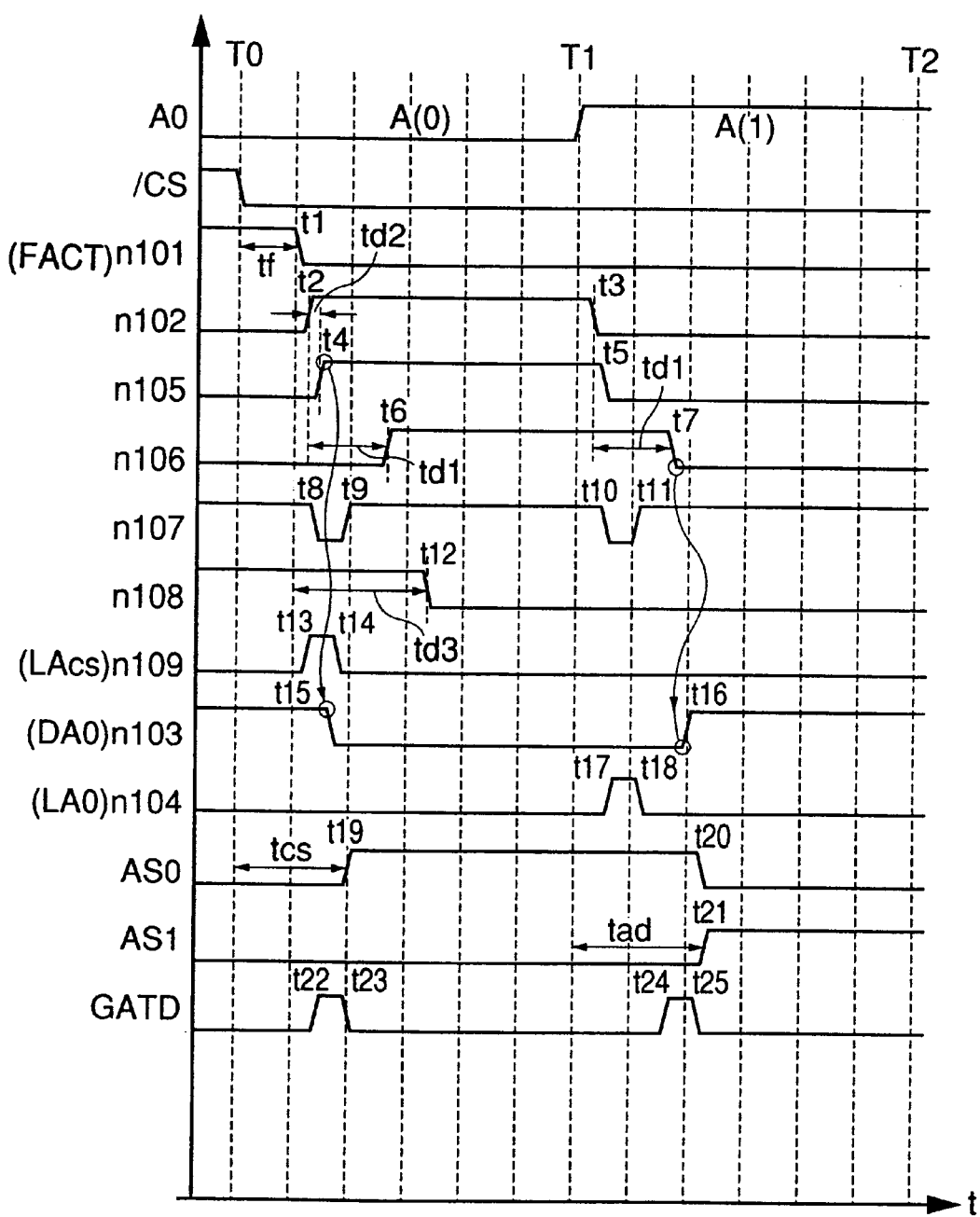
FIG. 8 is a timing chart illustrating an operation of address buffer 100.

FIG. 8 is a timing chart illustrating the operation of address buffer 100 according to the first embodiment of the present invention.

With reference to FIG. 8, during the time from T0 to T1, CS access that is started with the activation of the address buffer in response to the activation of chip select signal /CS is performed; whereas during the time from T1 to T2, address access that is started in response to the change of the address signal under the condition that the address buffer has already been activated is performed.

In the case of CS access during the time from T0 to T1, address A0 is at the L level, and thus, address A(0) is selected. In the case of address access during the time from T1 to T2, address A(1) is selected, with address A0 being at the H level.

At time T0, chip select signal /CS is activated, changing from the H level to the L level. In response thereto, address buffer activation circuit 222 activates address buffer activation signal FACT at timing t1, tf later than time T0, and thus, the voltage level of node n101 changes from the H level to the L level.

In response, the voltage level of node n102 changes from the L level to the H level at timing t2. This change in voltage level of node n102 is transmitted to node n105 after delay time td2 is added thereto by delay circuit 230. Likewise, the change in voltage level of node n102 is transmitted to node n106 after delay time td1 is added by delay circuit 220.

Local ATD circuit 255 causes the level of a one-shot pulse that is output to node n107 to change to an L level during the time from timing t8 to timing t9, in response to the change in voltage level of node n102. The voltage level of node n108 is kept at the H level by delay circuit 240 until delay time td3 has passed from the timing t1 at which address buffer activation signal FACT is activated.

Thus, the signal level of address signal A0 is transmitted to nodes n105 and n106. However, since only clocked inverter 252 is activated, node n103 receives the inverted state of the voltage level of node n105 at timing t15. In response to the change in voltage level of node n103, address decoder 40 sets address select signal AS0 to the H level at timing t19.

The time required for generation of the address select signal in the case of CS access is expressed as "tcs", which is considerably reduced compared to the time required in the conventional case that is determined by the sum of tf and td1. In addition, by setting td2 corresponding to tf, it is possible to set the length of tcs equal to that of td1. This enables adequate margin to be secured for write recovery time, that is a primary object of the address buffer.

In the case of CS access, the one-shot pulse output to node n107 by local ATD circuit 255 is not transmitted to node n104 or to global ATD circuit 70, because the voltage level of node n108 is at the H level.

As described above, in the case of CS access, global ATD circuit 70 activates address transition detecting signal GATD in response to one-shot pulse signal LAcs generated by pulse generating circuit 260 onto node n109.

The time from timing t13 when one-shot pulse signal LAcs rises to timing t22 when address transition detecting signal GATD is activated is set by delay time Dcs that is set by delay circuit 74 described in conjunction with FIG. 3.

Now, the operation in the case of address access during the time from T1 to T2 will be described. At time T1, the address buffer is already activated due to the activation of chip select signal /CS. Therefore, the access is started with the change in signal level of address signal A0.

The voltage level of node n102 changes from the H level to the L level at timing t3 in response to the change of address signal A0. The change in voltage level of node n102 is transmitted to nodes n105 and n10G via delay circuits 230 and 220, respectively.

Delay time td3 is set by delay circuit 240 such that, in the case of CS access, the voltage level of address signal A0 is reflected to that of node n102 (at timing t2), and such that the voltage level of node n108 changes to the L level after the activation of the one-shot pulse signal at node n107 is completed (at timing t9).

In addition, delay time td3 is set such that the voltage level of node n108 changes to the L level during the CS access. Therefore, in the case of address access, clocked inverter 254 is activated, while clocked inverter 252 is inactivated.

Thus, in the address access, the signal on node n106, i.e., the output of delay circuit 220, is transmitted to node n103 on which signal DA0 is output. Accordingly, time tad from time T1 to the time when address select signal AS1 is set to the H level is determined by delay time td1 that is set by delay circuit 220. Therefore, it becomes possible to secure a sufficient margin for write recovery time in the case of address access that is started after the address buffer has already been activated.

Further, in the address access, the voltage level of node n108 has changed to the L level, and thus, the output of local ATD circuit 255 is transmitted to global ATD circuit 70 via nodes n107 and n104. Therefore, global ATD detecting circuit 70 activates address transition detecting signal GATD for a prescribed time period in response to the one-shot pulse signal generated on node n107.

The time from timing t17 when one-shot pulse signal LA0 rises to timing t24 when address transition detecting signal GATD is activated is determined by delay time D0 that is set by delay circuit 72-0 described in conjunction with FIG. 3.

As described above, in address buffer 100 according to the first embodiment of the present invention, in the case of CS access, the address signal is transmitted to address decoder 40 after adding delay time td2 thereto, instead of delay time td1 that is longer than td2 and is set for securing adequate margin for write recovery time in the case of address access. Accordingly, it is possible to eliminate the delay in generation of the address select signal in the case of CS access as described in the background art section. It is thus possible to speed up the CS access that is started with the activation of the address buffer.

Second Embodiment

In the second embodiment, operation of an address buffer provided with a byte control function will be described.

Figure 9:
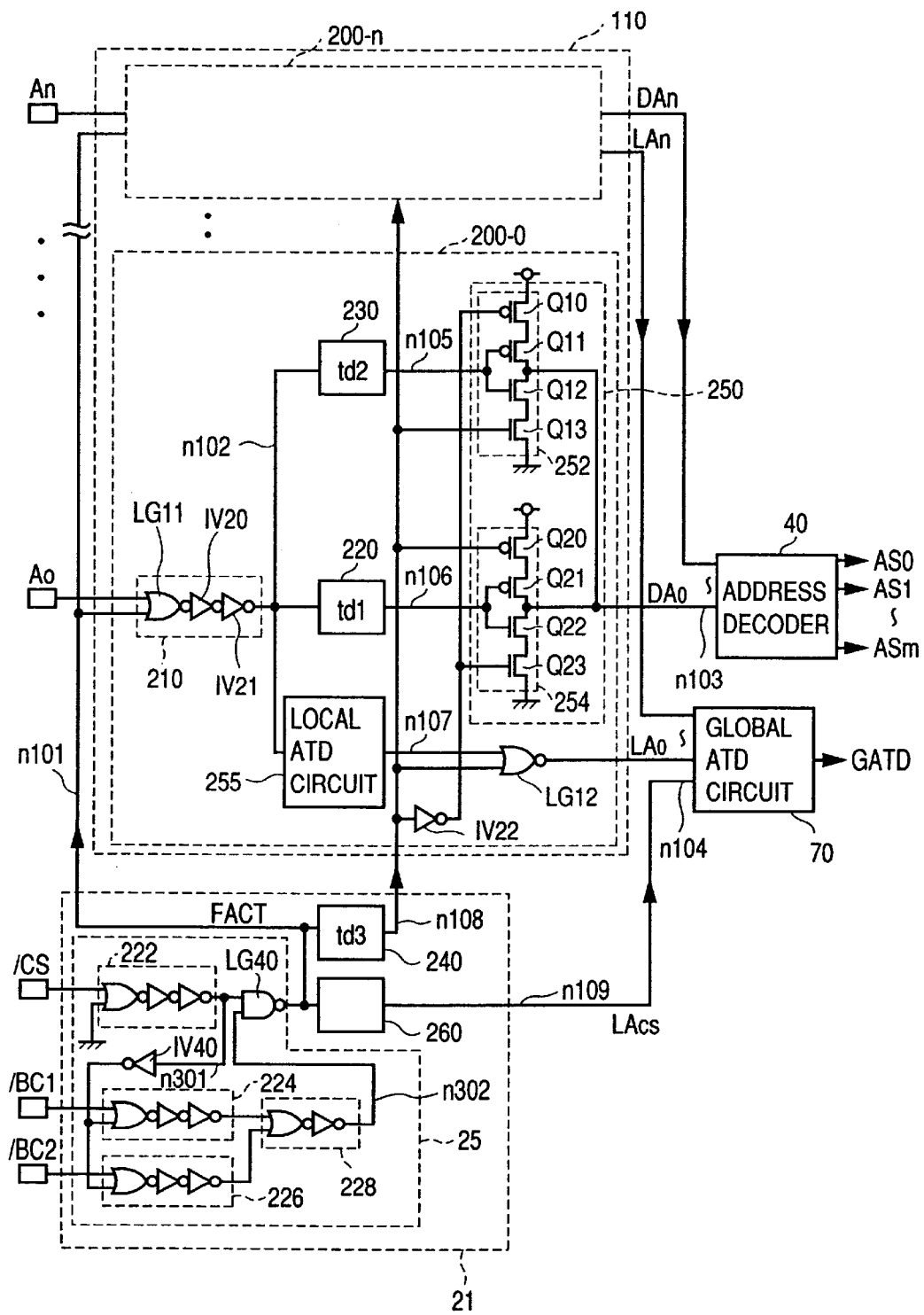
FIG. 9 is a block diagram showing a configuration of an address buffer 110 and peripheral circuits thereof according to a second embodiment of the present invention.

FIG. 9 is a block diagram showing a configuration of an address buffer 110 and peripheral circuits thereof, according to the second embodiment of the present invention.

The second embodiment is different from the first embodiment in that a control circuit 21 is provided instead of control circuit 20, and the address buffer is activated, not according only to chip select signal /CS, but according to a combination of /CS signal and byte control signals /BC1 and /BC2. The function of byte control signals has been described in the background art section.

Control circuit 21 includes an address buffer activation circuit 25 that activates address buffer activation signal FACT according to the combination of the states of signals /CS, /BC1 and /BC2.

The configuration of address buffer activation circuit 25 is identical to that of control circuit 555 described in the background art section. It inactivates address buffer activation signal FACT (to the H level) when chip select signal /CS is in an inactive state (at an H level) and when both byte control signals /BC1 and /BC2 are in an inactive state (at the H level). It activates FACT when chip select signal /CS is activated (to the L level) and at least one of byte control signals /BC1 and /BC2 is activated.

Address buffer activation signal FACT is transmitted via node n101 as in the first embodiment. Address buffer 110 has a configuration similar to that of address buffer 100 described in the first embodiment. It is designed to speed up CS access and BC access started with activation of the address buffer, by adding, in the case of these CS and BC accesses, a delay time that is shorter than in the case of a normal address access.

Control circuit 21 further includes: a delay circuit 240 that transmits activation of address buffer activation signal FACT to node n108 after adding delay time td3 thereto; and a pulse generating circuit 260 that generates a one-shot pulse at the timing of activation of signal FACT. The configurations, operations and purposes of delay circuit 240 and pulse generating circuit 260 are the same as in the first embodiment, and thus, the description thereof will not be repeated.

The operation of address signal input circuit 200 according to the signal level of address buffer activation signal FACT and the voltage level of node n108 is identical to that in the first embodiment, and therefore, the description thereof is not repeated.

Figure 10:
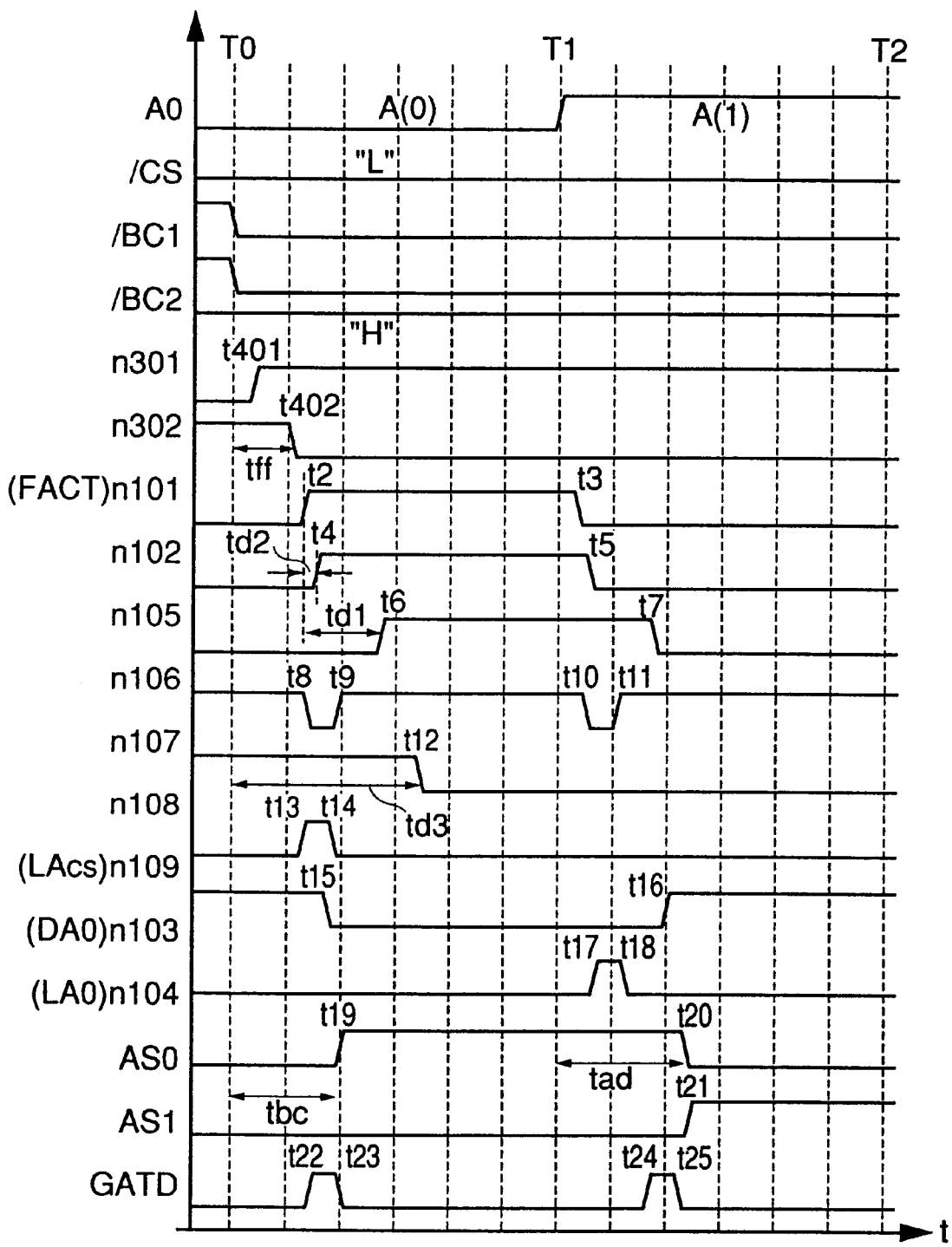
FIG. 10 is a timing chart illustrating an operation of address buffer 110.
Figure 11:
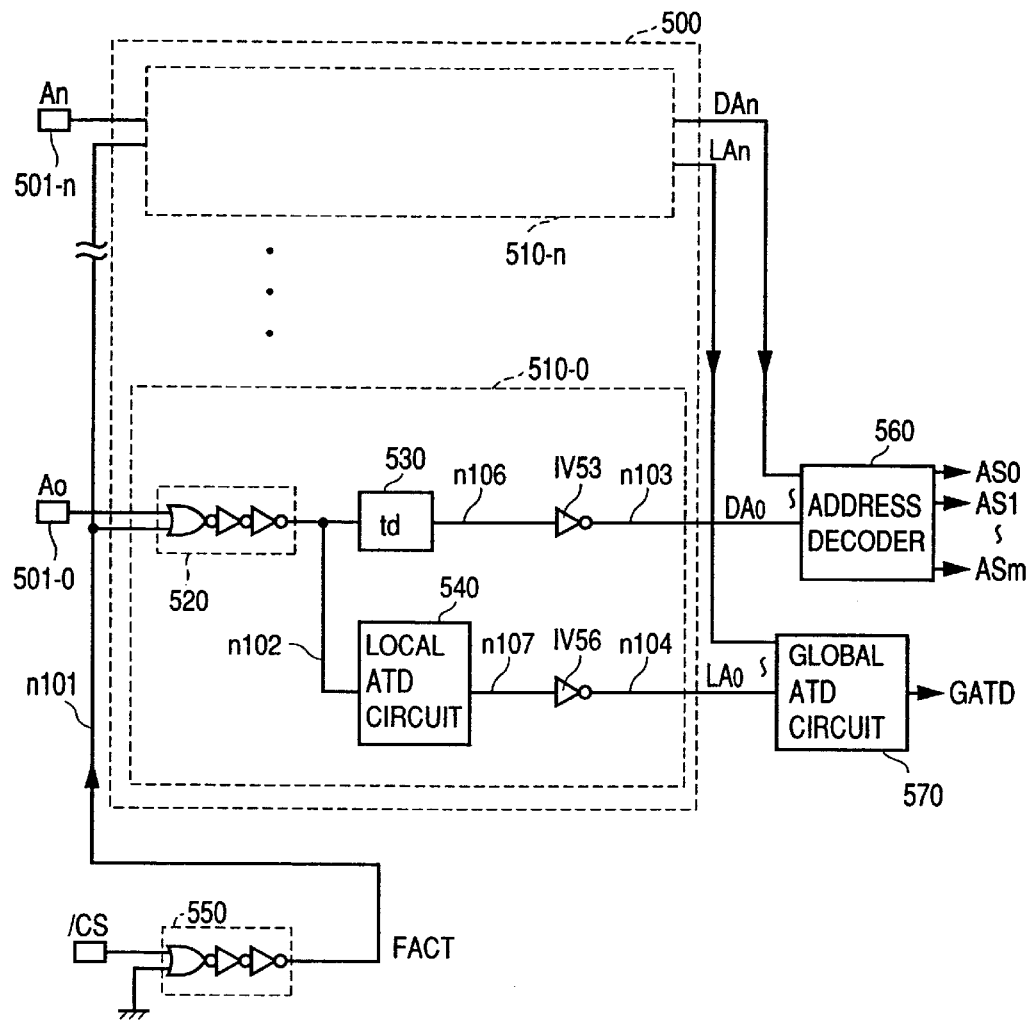
FIG. 11 is a block diagram showing a configuration of a conventional address buffer 500 and peripheral circuits thereof.
Figure 12:
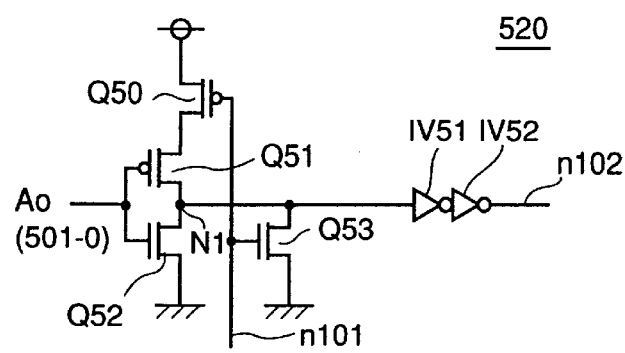
FIG. 12 is a circuit diagram showing a configuration of an address signal transmission circuit 520.
Figure 13:
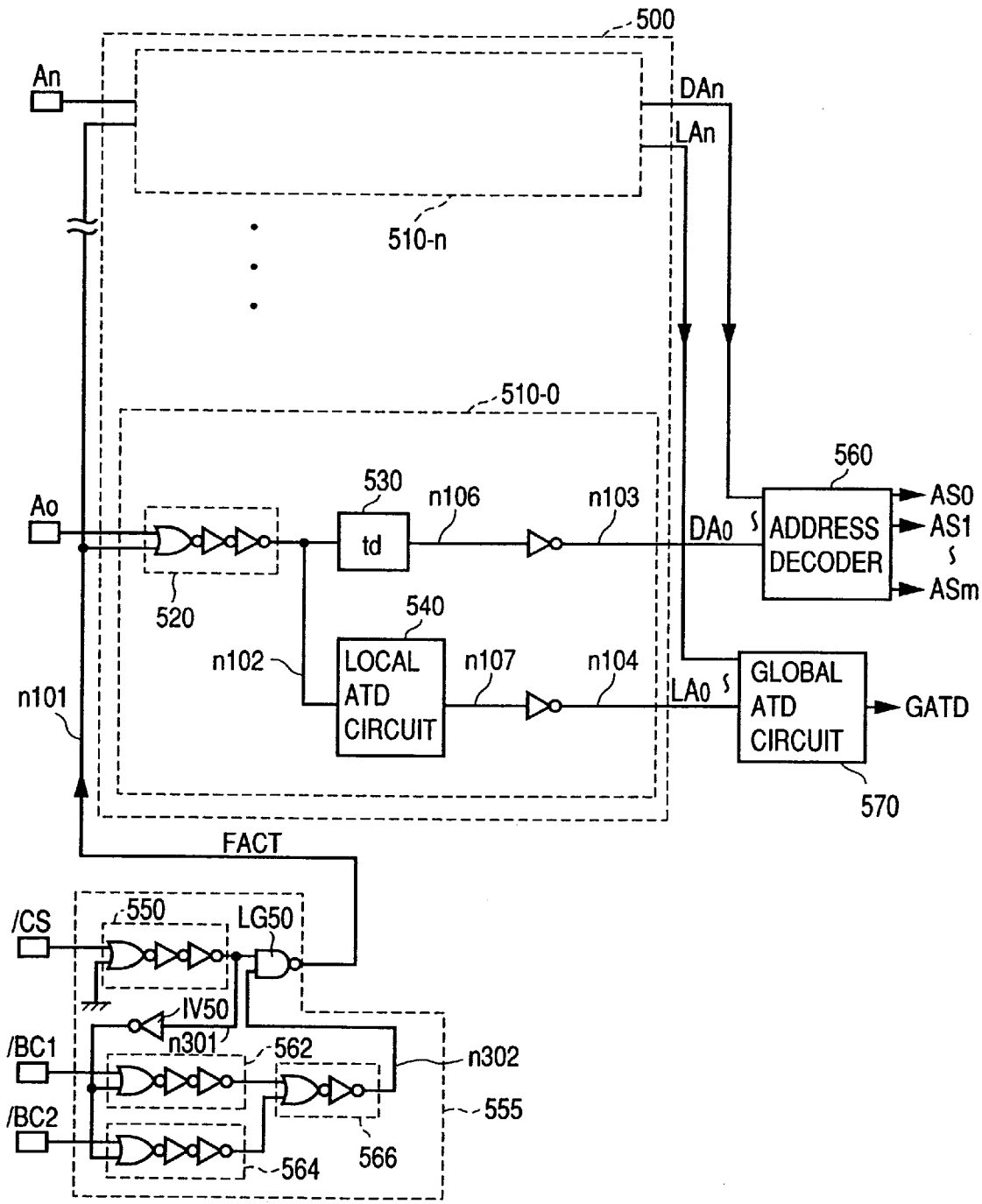
FIG. 13 is a block diagram showing a configuration of a conventional address buffer having a byte control function and peripheral circuits thereof.
Figure 14:
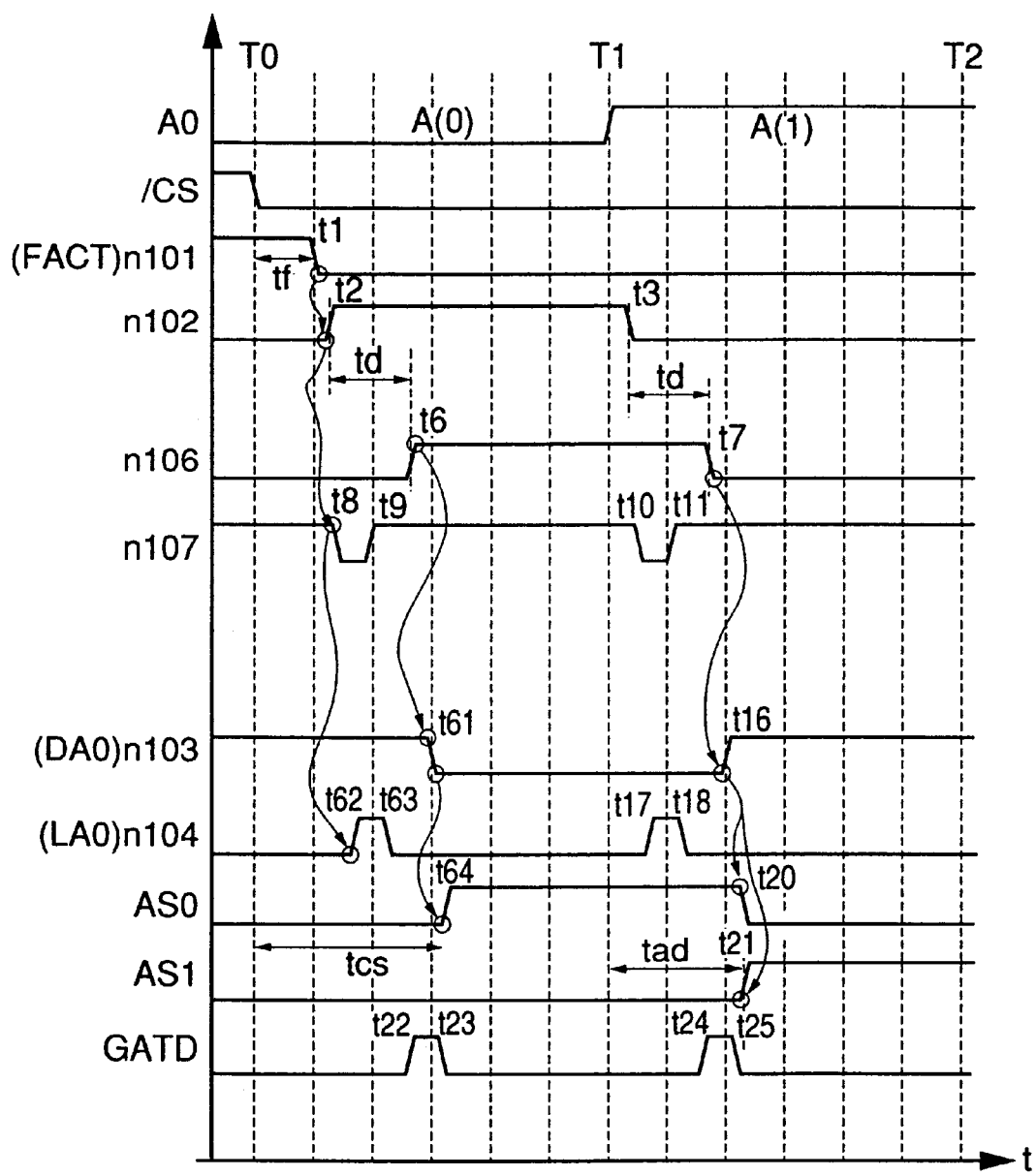
FIG. 14 is a timing chart illustrating an operation of the address buffer shown in FIG. 11 and problems thereof.
Figure 15:
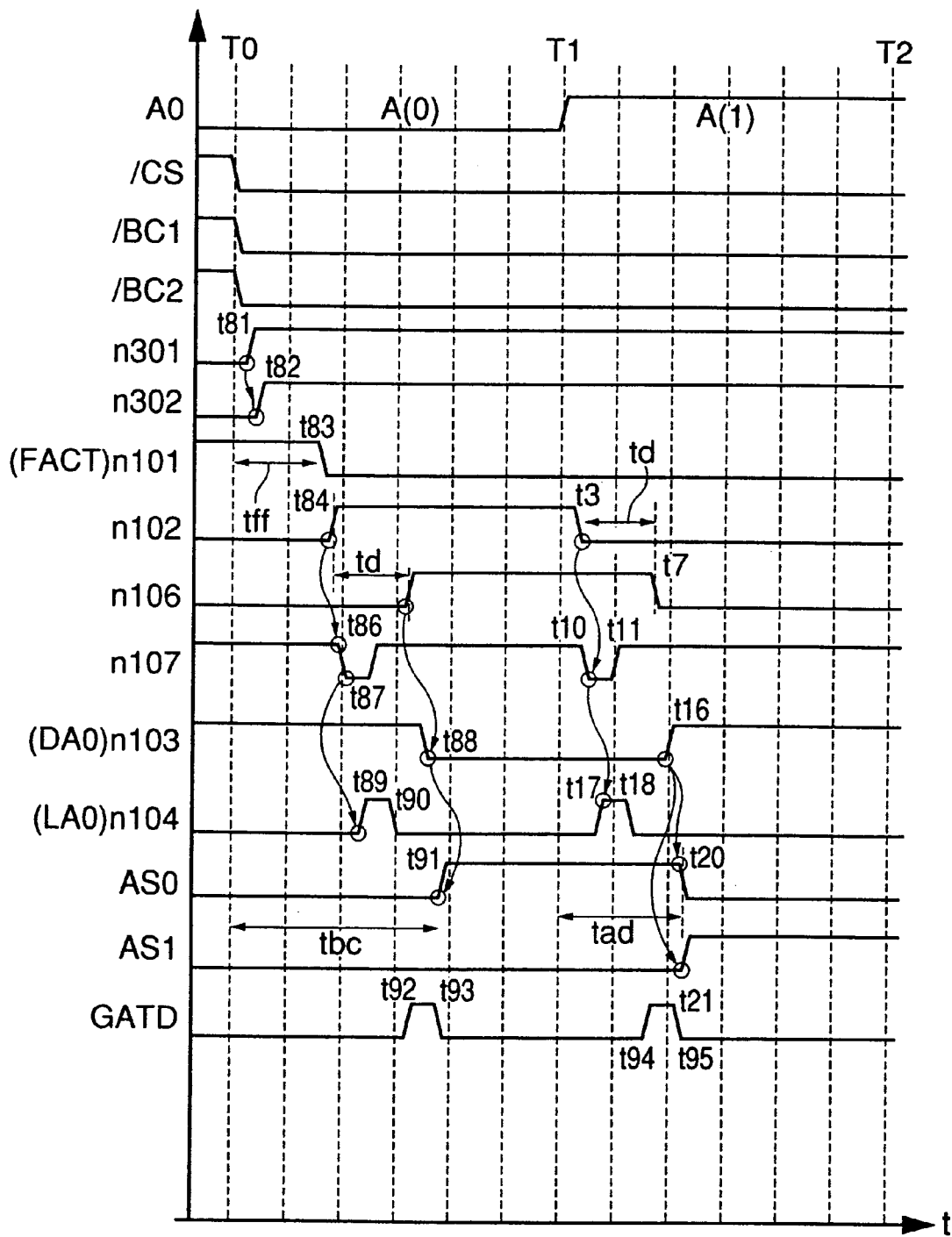
FIG. 15 is a timing chart illustrating an operation of the address buffer shown in FIG. 13 and problems thereof

FIG. 10 is a timing chart illustrating the operation of address buffer 110.

Referring to FIG. 10, illustrated during the time period from time T0 to time T1 is a BC access, that is started by activation of /BC1 signal and /BC2 signal while /CS signal is in an active state. Shown during the time period from T1 to T2 is an address access that is started by a change in the address signal after the address buffer has been activated.

At time T0, /BC1 signal and /BC2 signal are activated, and in response thereto, address buffer activation signal FACT is activated at timing t402 after a lapse of time tff. Therefore, the potential level of node n101 changes from the H level to the L level.

The operation from activation of address buffer activation signal FACT to generation of address select signal AS0 is similar to that in the first embodiment, and thus, description thereof is not repeated. Also in the case of BC access, the delay time to be added to the address signal input circuit can be set as delay time td2 that is shorter than delay time td1 in the case of normal address access. Therefore, a time tbc that is required from the timing of activation of the byte control signal to the generation of the address select signal can be set as a sum of t1f and delay time td2, which is considerably shorter than the time required for the BC access in the conventional case.

The operation of the address input circuit in the case of address access is similar to that in the first embodiment. Thus, description thereof is not repeated.

With such a configuration wherein address buffer 110 has a byte control function, even if activation of an address buffer is performed by a combination of chip select signal /CS and byte control signals /BC1, /BC2, the time required from the start of the access to the generation of the address select signal can be shortened and thus the operating speed can be increased in the case of CS and BC accesses that are to be started with activation of the address buffer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device performing an operation cycle to input/output a data signal in response to a command signal and an address signal received at signal input nodes, comprising:

a memory cell array having a plurality of memory cells arranged in rows and columns;

an address decode circuit responsive to said address signal for selecting at least one of said memory cells;

a control circuit responsive to said command signal for activating an address buffer activation signal to start an operation for receiving said address signal; and an address buffer circuit provided between said signal input nodes and said address decode circuit, for performing transmission of said address signal from said signal input nodes to said address decode circuit when said address buffer activation signal is in an active state to execute said operation for receiving said address signal, and for stopping the transmission of said address signal to said address decode circuit when said address buffer activation signal is in an inactive state, said address buffer circuit transmitting said address signal to said address decode circuit after a lapse of a first delay time when said address buffer circuit is unready to start said operation for receiving said address signal at a start of said operation cycle, and transmitting said address signal to said address decode circuit after a lapse of a second delay time that is longer than said first delay time when said address buffer circuit is ready to start said operation for receiving said address signal at the start of said operation cycle.

2. A semiconductor memory device performing an operation cycle to input/output a data signal in response to a command signal and an address signal received at signal input nodes, comprising:

a memory cell array having a plurality of memory cells arranged in rows and columns;

an address decode circuit responsive to said address signal for selecting at least one of said memory cells;

a control circuit responsive to said command signal for activating an address buffer activation signal to start an operation for receiving said address signal; and an address buffer circuit provided between said signal input nodes and said address decode circuit and responsive to said address buffer activation signal for performing/stopping transmission of said address signal to said address decode circuit, said address buffer circuit transmitting said address signal to said address decode circuit after a lapse of either one of a first delay time and a second delay time selected according to said command signal, wherein said address buffer circuit includes an address input transmission circuit that transmits a voltage level of said address signal to a first node when said address buffer activation signal is at an active state, a first delay circuit that outputs a voltage level at said first node to a second node after a lapse of said first delay time, a second delay circuit that outputs the voltage level at said first node to a third node after a lapse of said second delay time, and a delay select circuit provided between said second and third nodes and said address decode circuit, that transmits the voltage level of said second node to said address decode circuit in a case of said operation cycle that is started with activation of said address buffer activation signal, and that transmits the voltage level of said third node to said address decode circuit in a case of said operation cycle that is started when said address buffer activation signal is already at an active state, said first delay time being shorter than said second delay time.

3. The semiconductor memory device according to claim 2, further comprising:

a data line for transmitting said data signal to be read and written;

a data line precharge circuit for precharging said data line to a prescribed potential; and an address transition detecting circuit for detecting transition of said address signal and generating an address transition signal to activate said data line precharge circuit, said address transition detecting circuit activating said address transition signal in response to the activation of said address buffer activation signal in the case of said operation cycle that is started with the activation of said address buffer activation signal, and activating said address transition signal in response to the change of said address signal in the case of said operation cycle that is started when said address buffer activation signal is already at the active state.

4. The semiconductor memory device according to claim 4, wherein said control circuit generates an access select signal that is activated after a lapse of a third delay time from the timing of activation of said address buffer activation signal and a first one-shot pulse signal that is activate in response to the activation of said address buffer activation signal;

said address buffer circuit further includes a local address transition detecting circuit that generates a second one-shot pulse signal that is activated in response to the transition of the voltage level of said first node, and a transfer gate circuit that transmits said second one-shot pulse signal to said address transition detecting circuit when said access select signal is at an active state;

said address transition detecting circuit activates said address transition signal in response to activation of at least one of said first and said second one-shot pulse signals; and said third delay time is longer than said first and said second delay times and is set such that said access select signal is activated by the time when said operation cycle started with the activation of said address buffer activation signal is completed.

5. The semiconductor memory device according to claim 2, wherein said command signal includes a chip select signal for activating operation of said semiconductor memory device, and said control circuit activates said address buffer activation signal in response to activation of said chip select signal.

6. The semiconductor memory device according to claim 2, wherein said data signal has a plurality of bits that are divided to M byte groups (M is a natural number), said command signal includes a chip select signal for activating the operation of said semiconductor memory device and M byte control signals for selecting activation group by group for said byte groups, and said control circuit activates said address buffer activation signal in response to activation of at least one of said chip select signal and said M byte control signals.

7. A semiconductor memory device performing an operation cycle to input/output a data signal in response to a command signal and an address signal received at signal input nodes, comprising:
- a memory cell array having a plurality of memory cells arranged in rows and columns;
- an address decode circuit responsive to said address signal for selecting at least one of said memory cells;
- a control circuit responsive to said command signal for activating an address buffer activation signal to start an operation for receiving said address signal; and
- an address buffer circuit provided between said signal input nodes and said address decode circuit and responsive to said address buffer activation signal for performing/stopping transmission of said address signal to said address decode circuit,
- said address buffer circuit transmitting said address signal to said address decode circuit after a lapse of either one of a first delay time and a second delay time selected according to said command signal, wherein
- said address buffer circuit includes
    - an address input transmission circuit that transmits a voltage level of said address signal to a first node when said address buffer activation signal is at an active state,
    - a first delay circuit that outputs a voltage level at said first node to a second node after a lapse of said first delay time,
    - a second delay circuit that outputs the voltage level at said first node to a third node after a lapse of said second delay time, and
    - a delay select circuit provided between said second and third nodes and said address decode circuit, that transmits the voltage level of said second node to said address decode circuit in a case of said operation cycle that is started with activation of said address buffer activation signal, and that transmits the voltage level of said third node to said address decode circuit in a case of said operation cycle that is started when said address buffer activation signal is already at an active state,
- said first delay time being shorter than said second delay time, and wherein
- said control circuit generates an access select signal that is activated after a lapse of a third delay time from a timing of activation of said address buffer activation signal,
- said delay select circuit transmits the voltage level of said second node to said address decode circuit before activation of said access select signal and transmits the voltage level of said third node to said address decode circuit after the activation of said access select signal, and
- said third delay time is set longer than said first and said second delay times and is set such that said access select signal is activated before said operation cycle started with the activation of said address buffer activation signal is completed.

8. A semiconductor memory device performing an operation cycle to input/output a data signal in response to a command signal and an address signal received at signal input nodes, comprising:
- a memory cell array having a plurality of memory cells arranged in rows and columns;
- an address decode circuit responsive to said address signal for selecting at least one of said memory cells;
- a control circuit responsive to said command signal for activating an address buffer activation signal to start an operation for receiving said address signal; and
- an address buffer circuit provided between said signal input nodes and said address decode circuit, for performing transmission of said address signal from said signal input nodes to said address decode circuit when said address buffer activation signal is in an active state, and for stopping the transmission of said address signal to said address decode circuit when said address buffer activation signal is in an inactive state,
- said address buffer circuit transmitting said address signal to said address decode circuit after a lapse of a first delay time when said address buffer activation signal is in the inactive state at a start of said operation cycle, and transmitting said address signal to said address decode circuit after a lapse of a second delay time when said address buffer activation signal is already in the active state at the start of said operation cycle.

9. The semiconductor memory device according to claim 8, wherein
- said first delay time is set shorter than said second delay time, taking into consideration the time required for the activation of said address buffer activation signal by said control circuit.

* * * * *